US006303391B1

United States Patent
Hintermaier et al.

(10) Patent No.: US 6,303,391 B1
(45) Date of Patent: *Oct. 16, 2001

(54) LOW TEMPERATURE CHEMICAL VAPOR DEPOSITION PROCESS FOR FORMING BISMUTH-CONTAINING CERAMIC FILMS USEFUL IN FERROELECTRIC MEMORY DEVICES

(75) Inventors: Frank S. Hintermaier; Christine Dehm, both of Munich; Wolfgang Hoenlein, Untorhaching, all of (DE); Peter C. Van Buskirk, Newtown, CT (US); Jeffrey F. Roeder, Brookfield, CT (US); Bryan C. Hendrix, Danbury, CT (US); Thomas H. Baum, New Fairfield, CT (US); Debra A. Desrochers, Brookfield, CT (US)

(73) Assignees: Advanced Technology Materials, Inc., Danbury, CT (US); Siemens Aktiengesellschaft, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/975,087

(22) Filed: Nov. 20, 1997

Related U.S. Application Data

(60) Provisional application No. 60/050,081, filed on Jun. 26, 1997.

(51) Int. Cl.$^7$ .................................................. H01L 21/00

(52) U.S. Cl. .............................. 438/3; 438/240; 438/785; 427/62; 427/126.3

(58) Field of Search .............................. 438/785, 3, 240; 427/62, 126.3

(56) References Cited

U.S. PATENT DOCUMENTS

| | | | |
|---|---|---|---|
| 4,975,299 | | 12/1990 | Mir et al. . |
| 5,296,455 | * | 3/1994 | Harada et al. ............................ 505/1 |
| 5,431,957 | * | 7/1995 | Gardiner et al. . |
| 5,478,610 | | 12/1995 | Desu et al. . |
| 5,519,566 | | 5/1996 | Perino et al. . |
| 5,527,567 | * | 6/1996 | Desu et al. ............................ 427/573 |
| 5,648,114 | | 7/1997 | Paz De Araujo et al. . |
| 5,840,897 | * | 11/1998 | Kirlin et al. .............................. 546/2 |
| 5,859,274 | * | 1/1999 | Baum et al. ............................ 556/76 |
| 5,902,639 | * | 5/1999 | Glassman et al. ................ 427/248.1 |
| 5,916,359 | * | 6/1999 | Baum et al. ...................... 106/287.18 |

OTHER PUBLICATIONS

Bunshah et al. "Deposition Technologies for Films and Coatings." 1982. 357–359.

Tingakai Li, et al: "Surface structure and morphology of $SrBi_2Ta_2O_9$(SBT) thin films", Structure and Evolution of Surfaces, Symposium, Structure and Evolution of Surfaces, Symposium, Boston, MA, USA, Dec. 2–5, 1996, pp. 407–412, XP000900949 1997 Pittsbourgh, PA, Mater. Res. Soc.*

* cited by examiner

*Primary Examiner*—Stephen D. Meier
*Assistant Examiner*—Maria Guerrero
(74) *Attorney, Agent, or Firm*—Steven J. Hultquist; Oliver A. M. Zitzmann; Robert A. McLauchlan

(57) ABSTRACT

A low temperature CVD process using a tris (β-diketonate) bismuth precursor for deposition of bismuth ceramic thin films suitable for integration to fabricate ferroelectric memory devices. Films of amorphous SBT can be formed by CVD and then ferroannealed to produce films with Aurivillius phase composition having superior ferroelectric properties suitable for manufacturing high density FRAMs.

14 Claims, 11 Drawing Sheets

LOW TEMPERATURE CHEMICAL VAPOR DEPOSITION PROCESS FOR FORMING BISMUTH-CONTAINING CERAMIC FILMS USEFUL IN FERROELECTRIC MEMORY DEVICES

CROSS-REFERENCE TO RELATED APPLICATIONS

This application claims the priority of United States provisional patent application no. 60/050,081 filed Jun. 26, 1997 in the names of Frank Hintermaier, Peter Van Buskirk, Jeffrey Roeder, Bryan Hendrix, Thomas H. Baum and Debra Desrochers for "A Low Temperature Chemical Vapor Deposition Process Using a Beta-Diketonate Bismuth Precursor for the Preparation of Bismuth Ceramic Thin Films for Integration in Ferroelectric Memory Devices." This application is being concurrently filed in the United States Patent and Trademark Office with the following United States patent application: U.S. patent application Ser. No. [file: ATM-167 CIP 2] in the names of Thomas H. Baum and Gautam Bhandari for "Alkane and Polyamine Solvent Compositions for Liquid Delivery Chemical Vapor Deposition;." In addition, this application is related to U.S. patent application Ser. No. [file: ATM-256] in the names of Thomas H. Baum, Gautam Bhandari and Margaret Chappuis for "Anhydrous Mononuclear Tris(Beta-Diketonate) Bismuth Compositions for Deposition of Bismuth-Containing Films, and Method of Making the Same;" filed Oct. 30, 1997. The disclosures of such provisional application, co-filed application and related application are hereby incorporated herein by reference in their entirety.

BACKGROUND OF THE INVENTION

1. Field of The Invention

The present invention relates to a chemical vapor deposition process for forming bismuth-containing material films on a substrate for applications such as the manufacture of ferroelectric memory devices.

2. Description of the Related Art

In recent years, ferroelectric materials have been the focus of widespread interest as components of non-volatile memory devices.

Non-volatile ferroelectric memory devices function by storage of information through the polarization of a thin ferroelectric material layer reposed between two plates of a capacitor structure. Each such ferroelectric capacitor is connected to a transistor to form a storage cell, in which the transistor controls the access of the read-out electronics to the capacitor. The transistor therefore is connected to bit-line and word-line elements, to constitute the storage cell.

The ferroelectric material may be utilized in a stacked capacitor structure which overlies the top of the transistor. The transistor drain (e.g., of a MOSFET structure) is connected to the bottom electrode of the capacitor by a plug formed of suitable materials such as polysilicon or tungsten.

Information subsequently can be changed in the ferroelectric memory cell by applying an electric field to the thin ferroelectric material layer to reverse ("flip") the polarization characteristic of the ferroelectric material. Ferroelectric memories (FRAMs), in contrast to dynamic random access memories (DRAMs), have the advantages of retaining stored information in the event of termination of the power supply, and do not require refresh cycles.

In such memory applications, ferroelectric materials desirably have the following electrical properties: (1) a low coercive field characteristic, facilitating use of a low voltage power supply; (2) a high remnant polarization characteristic, ensuring highly reliable information storage; (3) absence of significant fatigue or life-time deterioration characteristics; (4) absence of any imprint which would alter the stored information (e.g., leading to a preference of a certain polarization such as a logical "1" over a logical "0" character) or otherwise impair the ability to "read" the stored information; and (5) extended retention time, for reliable data storage over an extended period of time.

The foregoing electrical property criteria are satisfied in the layered pseudo-perovskite or "Aurivillius" phase of materials such as strontium bismuth tantalate, $SrBi_2Ta_2O_9$. This strontium bismuth tantalate composition is sometimes hereinafter referred to as "SBT." As a result of these favorable characteristics, significant efforts have been initiated to integrate SBT in memory devices. Ferroelectric capacitor structures utilizing SBT as the ferroelectric material have been made in the prior art by sol-gel techniques and demonstrate superior electrical properties.

Unfortunately, however, such sol-gel methodology permits only a low integration density to be achieved. Some improvement in the sol-gel methodology may be gained by mist or electrospray methods, permitting fabrication of memories up to 4 megabit in capacity.

To achieve higher integration density of SBT with smaller structure sizes (e.g., having a minimal feature size below about 0.7 micron), it is necessary to utilize chemical vapor deposition (CVD) processes, since CVD affords better conformality and step coverage than layers produced by any other deposition method. Further, the CVD process yields deposited films having a high film uniformity, high film density, and the capability to grow very thin films at high throughput and low cost.

Concerning relevant art to the present invention, U.S. Pat. No. 5,527,567 to Desu et al. discloses CVD of a ferroelectric layered structure in a single-step or a two-step process at temperatures which in the single-step process may be in the range of 450–600° C., and in the two-step process may be in the range of 550–700° C. in the first step and 600–700° C. in the second step. The Desu et al. patent describes post-deposition treatment steps including annealing, deposition of a top electrode, and further annealing.

Desu et al. describe as suitable precursors for the respective bismuth, strontium and tantalum components of the SBT film triphenyl bismuth, strontium bis(2,2,6,6-tetramethylheptane-2,5-dionate)tetraglyme adduct and tantalum pentaethoxide, with such precursors being utilized in a solvent medium such as an 8:2:1 mixture of tetrahydrofuran, isopropanol and tetraglyme. The Desu et al patent mentions $Bi(thd)_3$.

The Desu et al patent describes vaporization at temperatures of 60–300° C. In a specific embodiment, Desu et al. teach evaporation of the precursors in a vaporizer by direct liquid injection, at a temperature in the range of 250–320° C., followed by growth of films from the vaporized precursor at a temperature in the range of 450–800° C. on a $Pt/Ti/SiO_2/Si$ or sapphire substrate, with post-deposition annealing at 750° C.

A related patent of Desu et al. is U.S. Pat. No. 5,478,610.

U.S. Pat. No. 5,648,114 describes a method of fabricating an electronic device including CVD deposition of a layered superlattice material which is post-treated to improve its properties.

The art continues to seek improvement in SBT and ferroelectric memory technologies.

It is an object of the present invention to provide an improved CVD process for the deposition of bismuth oxide materials (e.g., $SrBi_2Ta_2O_9$, $Bi_4Ti_3O_{12}$, etc.), including materials of such type for formation of ferroelectric thin films for applications such as ferroelectric memory devices.

Other objects of the invention will be more fully apparent from the ensuing disclosure and appended claims.

SUMMARY OF THE INVENTION

The present invention relates to an improved chemical vapor deposition process for forming bismuth-containing films on substrates for applications such as ferroelectric memory devices.

In one aspect, the present invention relates to a process for depositing bismuth-containing material on a substrate by chemical vapor deposition from a precursor which is vaporized to form a precursor vapor which is then contacted with the substrate. The precursor for depositing the bismuth-containing material is a bismuth β-diketonate.

In one specific aspect of the invention, the precursor for forming the bismuth-containing material on the substrate comprises an anhydrous mononuclear bismuth β-diketonate, a new material.

In a further specific aspect, the present invention relates to the formation of a bismuth-containing material by chemical vapor deposition using $Bi(thd)_3$.

In another aspect, the invention relates to formation of a bismuth-containing ferroelectric film such as SBT, including deposition of bismuth from a bismuth β-diketonate precursor of the formula $BiA_xB_y$ wherein A=β-diketonate, B=another ligand which is compatible with the use of the composition as a precursor for formation of bismuth-containing material on a substrate, x=1, 2 or 3, and y=3−x.

In the practice of the present invention, the β-diketonate ligand of the anhydrous mononuclear tris(β-diketonate) bismuth composition may be of any suitable type, including the illustrative β-diketonate ligand species set out in Table I below:

TABLE I

| Beta-diketonate ligand | Abbreviation |
| --- | --- |
| 2,2,6,6-tetramethyl-3,5-heptanedionato | thd |
| 1,1,1-trifluoro-2,4-pentanedionato | tfac |
| 1,1,1,5,5,5-hexafluoro-2,4-pentanedionato | hfac |
| 6,6,7,7,8,8,8-heptafluoro-2,2-dimethyl-3,5-octanedionato | fod |
| 2,2,7-trimethyl-3,5-octanedionato | tod |
| 1,1,1,5,5,6,6,7,7,7-decafluoro-2,4-heptanedionato | dfhd |
| 1,1,1-trifluoro-6-methyl-2,4-heptanedionato | tfmhd |

The composition and the synthesis of such bismuth tris (β-diketonate) precursors are more fully disclosed and claimed in co-filed U.S. patent application Ser. No. [File: ATM-256] filed Oct. 30, 1997 in the names of Thomas H. Baum, Gautam Bhandari and Margaret Chappuis for "Anhydrous Mononuclear Tris (β-Diketonate) Bismuth Compositions for Deposition of Bismuth-Containing Films, and Method of Making the Same," the disclosure of which hereby is incorporated herein by reference in its entirety.

In such deposition of bismuth on a substrate, for applications such as the formation of SBT ferroelectric thin films, the use of the anhydrous mononuclear bismuth source material provides improved thermal transport and flash vaporization.

Although the mononuclear bismuth source material is highly preferred in the practice of the present invention, the invention also contemplates the use of binuclear bismuth precursors, as well as mixtures of mononuclear and binuclear bismuth source materials.

In another aspect, the present invention relates to a method of forming an SBT film on a substrate by chemical vapor deposition from precursors for the strontium, bismuth and tantalum constituents, wherein the bismuth precursor comprises a bismuth tris (β-diketonate) complex. The strontium and tantalum precursors may be of any suitable precursor types as source materials for such metal components, but strontium $(2,2,6,6\text{-tetramethyl-3,5-heptanedionato})_2(L)$, wherein the ligand L is tetraglyme or pentamethyldiethylenetriamine, is a preferred Sr precursor, and the tantalum precursor most preferably comprises $Ta(OiPr)_4(2,2,6,6\text{-tetramethyl-3,5-heptanedionate})$.

For liquid delivery, the above-discussed SBT precursors may be mixed with any suitable solvent medium, e.g., an 8:2:1 mixture of tetrahydrofuran/isopropanol/tetraglyme, or, more preferably, a 5:4:1 ratio mixture of octane, decane and pentamethyldiethylenetriamine, with the respective Sr, Bi and Ta precursors being individually stored (in solution) in separate reservoirs or supply vessels.

Prior to delivery, the three precursor solutions may be mixed in a liquid delivery system such as that disclosed in U.S. Pat. No. 5,204,314 issued Apr. 20, 1993 in the names of Peter S. Kirlin, et al., the disclosure of which hereby is incorporated herein by reference in its entirety. The resulting precursor liquid mixture then may be vaporized at suitable temperature in the range of for example 150–240° C., optionally with argon or other carrier gas to transport the resulting multicomponent precursor vapor to the CVD reactor for contacting with the hot substrate. The carrier gas may be mixed with or initially contain oxygen or other oxidant gas.

The precursor vapor in the CVD reactor is contacted with the substrate, as for example a $Pt/Ti/SiO_2/Si$ wafer at a temperature which for example may be on the order of 300–450° C., for sufficient time to permit film growth to occur to the desired extent.

The SBT film formed by such method may be an amorphous film or an oriented fluorite-containing film (fluorite usually being oriented, but not always highly), or a combination of the two forms. The amorphous film when present can be transformed to a fluorite structure which can then be transformed to the desired Aurivillius phase by a post-deposition anneal process.

Alternatively, the amorphous film may be post-treated to convert same directly to the Aurivillius phase. The annealing temperatures usefully employed to transform an SBT film deposited from a bismuth β-diketonate precursor into a ferroelectric Aurivillius phase are in the range of about 600 to about 820° C.

The solvent mixture of 8:2:1 tetrahydrofuran/isopropanol/ tetraglyme described above is illustrative, and other solvent mixtures may be employed. A particularly preferred solvent mixture for the precursors is a 5:4:1 octane/decane/ pentamethyldiethylenetriamine mixture.

While the method of the invention is primarily addressed herein in relation to formation of ferroelectric SBT films and device structures on a substrate, the invention is also generally applicable to the formation of other ferroelectric films, including bismuth-containing strontium-based materials, bismuth-containing titanium-based materials and other bismuth-containing film materials including other metallic and oxide components.

Other aspects and features will be more fully apparent from the ensuing disclosure and appended claims.

DETAILED DESCRIPTION OF THE INVENTION, AND PREFERRED EMBODIMENTS THEREOF

Figure 1:
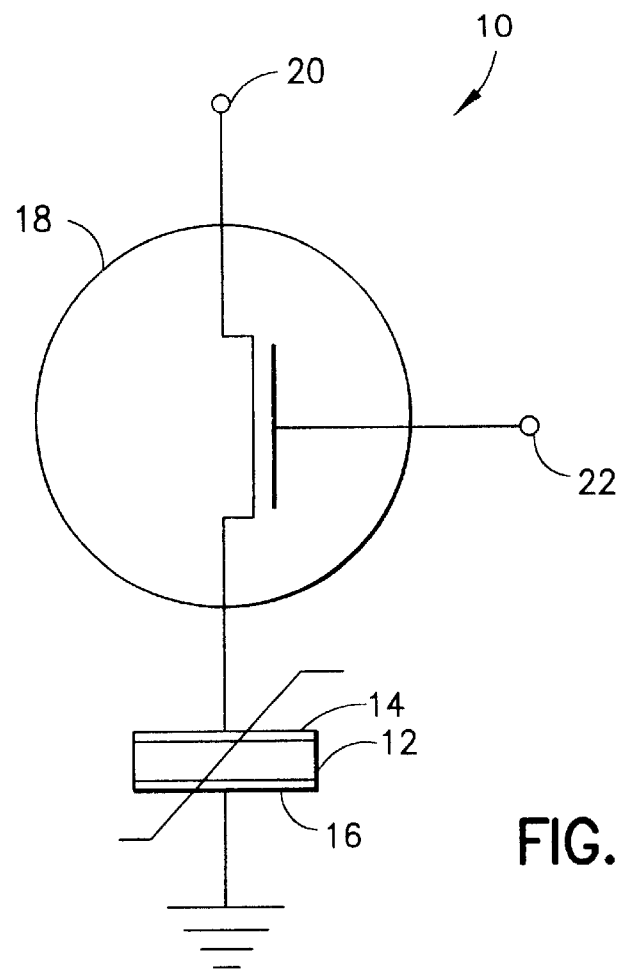
FIG. 1 is a schematic representation of a ferroelectric memory storage cell.

The present invention is based on the discovery that bismuth β-diketonates may be usefully employed to carry out relatively low temperature chemical vapor deposition of bismuth-containing films, such as bismuth-containing ferroelectric, semiconductor and superconducting films, or films which may be transformed by subsequent processing into product films exhibiting such ferroelectric, semiconductor or superconductor properties. For example, SBT films may initially be deposited with paraelectric properties, and subsequently be subjected to annealing to produce ferroelectric product SBT films.

The bismuth precursor of the present invention has been found to afford unexpected advantages in the CVD process, which in turn overcome the deficiencies associated with prior art usage of triphenyl bismuth, which has been the prior art's "standard" precursor for bismuth in CVD applications. In a preferred embodiment, the bismuth precursor is mononuclear anhydrous $Bi(thd)_3$.

The deficiencies associated with the triphenyl bismuth precursor are significant. The use of triphenyl bismuth as a bismuth precursor in standard solvent solutions such as 8:2:1 tetrahydrofuran/isopropanol/tetraglyme requires temperatures above 470° C. to achieve acceptable $Bi_2O_3$ deposition rates. It is desirable, however, to minimize deposition temperatures, since migration of bismuth and $Bi_2O_3$ into the bottom electrode and into the substrate of ferroelectric capacitor structures increases with increasing temperature, leading to loss of bismuth in the ferroelectric film. Such migration also presents a potential for bismuth contamination in deeper parts of the device structure, as well as significant instability of the plug structure of the ferroelectric capacitor and any barrier between the plug and the bottom electrode relative to oxidation thereof above 500° C.

The high deposition temperatures used in the prior art with triphenyl bismuth as the bismuth precursor are detrimental to plug conductance characteristics. The lower temperatures permitted by the mononuclear β-diketonate bismuth precursor in the process of the present invention permit plug conductance to be more readily maintained at desired levels, and enable films of improved conformality to be realized.

In contrast, films formed from β-diketonate precursors in accordance with the present invention have a much better conformality and morphology than those achieved using triphenyl bismuth as a precursor.

The triphenyl bismuth precursor of the prior art presents a functional mismatch with the Sr and Ta precursors used in the CVD process. The deposition rate for SrO and $Ta_2O_5$ is high at low pressures (e.g., 1 torr), but in contrast the $Bi_2O_3$ deposition rate is low. At high pressures on the order of 6–10 torr, $Bi_2O_3$ deposition rates from the triphenyl bismuth precursor are high, while the SrO and $Ta_2O_5$ deposition rates are low. This opposedly mismatching character results in a very small "process window" for adequate operability for the CVD process.

By contrast, the (β-diketonate) bismuth precursor of the present invention is well matched with the strontium and tantalum precursors, and when such bismuth source is used, all of the precursors have a high deposition rate at low pressures on the order of 1 torr. The well-matched character of the (β-diketonate) bismuth precursor permits a wide process window to be utilized, for highly flexible processing in the formation of SBT films.

Deposition of bismuth from triphenyl bismuth frequently exhibits a time-dependent growth rate and a time-dependent film composition, probably resulting from the high sensitivity of the $Bi_2O_3$ deposition on the substrate. After nucleation has been initiated at the beginning of the CVD process, and SBT has been deposited on the material of the bottom electrode, growth of the film has to continue on the SBT material layer. It frequently occurs that bismuth incorporation efficiency from triphenyl bismuth changes during deposition, resulting in changes in the growth rate and film composition over time.

When utilizing the (β-diketonate) bismuth precursor, the $Bi_2O_3$ deposition rate is more stable, because the precursor is less parameter-sensitive (e.g., oxygen-sensitive) and less substrate-sensitive. By contrast, triphenyl bismuth deposition is very sensitive to process parameters such as pressure, gas flow, oxygen concentration, etc. In consequence, a constant film growth and time-independent film composition are more closely approached when using a (β-diketonate) bismuth composition as the precursor material.

When using triphenyl bismuth as a bismuth precursor, the reproducibility of the CVD process from run-to-run, and the uniformity within a wafer, are often very low. With such precursor, the $Bi_2O_3$ deposition rate is highly sensitive to any process parameters and to any changes of the substrate surface. For example, bismuth may back-migrate from deposits on heating elements or the CVD reactor chamber onto the substrate, and such additional bismuth can change nucleation and film growth characteristics dramatically.

Using (β-diketonate) bismuth precursors, lower sensitivity is achieved in relation to process parameters as well as in relation to the character of the bottom electrode. In addition, run-to-run reproducibility and uniformity within a wafer are excellent when such (β-diketonate) bismuth complex is employed as the precursor in the CVD process.

The SBT films formed by the CVD process of the present invention may be utilized to form a wide variety of structures and devices. An illustrative device is shown in FIG. 1. The ferroelectric memory storage cell 10 is shown schematically as comprising a thin ferroelectric material layer 12 between plates 14 and 16 of a capacitor. Such capacitor is connected to the transistor 18 to form the storage cell, with the transistor being joined to a bit-line element 20 and to a word-line element 22, as shown.

Figure 2:
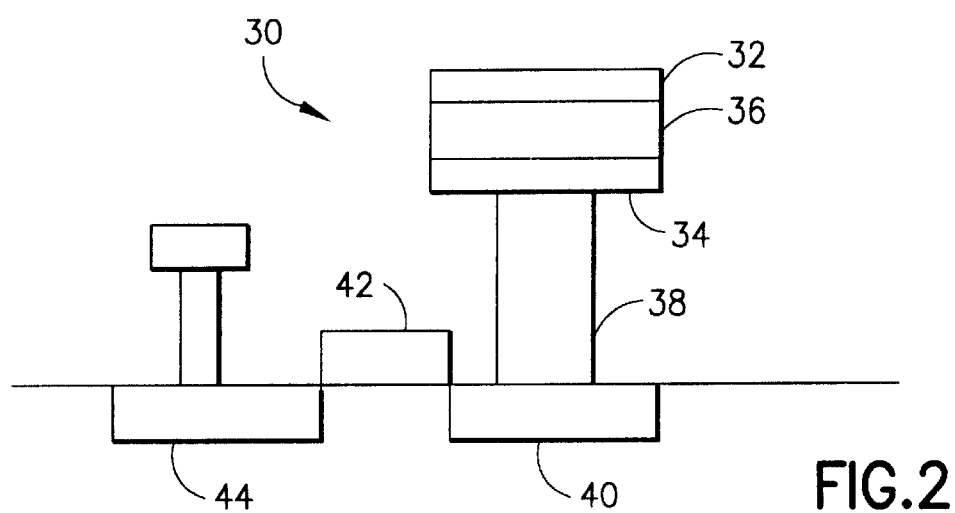
FIG. 2 is a schematic representation of a stacked capacitor which is plug-connected to the drain of a MOSFET structure, wherein the device utilizes an SBT ferroelectric capacitor layer.

FIG. 2 is a schematic representation of a stacked capacitor and transistor assembly illustrating how the SBT material can be integrated in a storage cell. The capacitor 30 comprises a top electrode 32, and bottom electrode 34 on which is disposed a thin film ferroelectric material layer 36, as shown. The bottom electrode 34 is connected by plug 38 to the drain 40 of the transistor. The plug may be made of any suitable material, as for example from polysilicon or tungsten. The transistor comprises gate 42 and a source 44.

Those skilled in the art will recognize that the "source" and "drain" regions of the structure shown in FIG. 2 may be reversed in relation to one another, with respect to the positions of such source and drain regions illustratively shown, to provide an equivalent conformation of the stacked capacitor and transistor assembly to that illustratively shown in the drawing.

Figure 3:
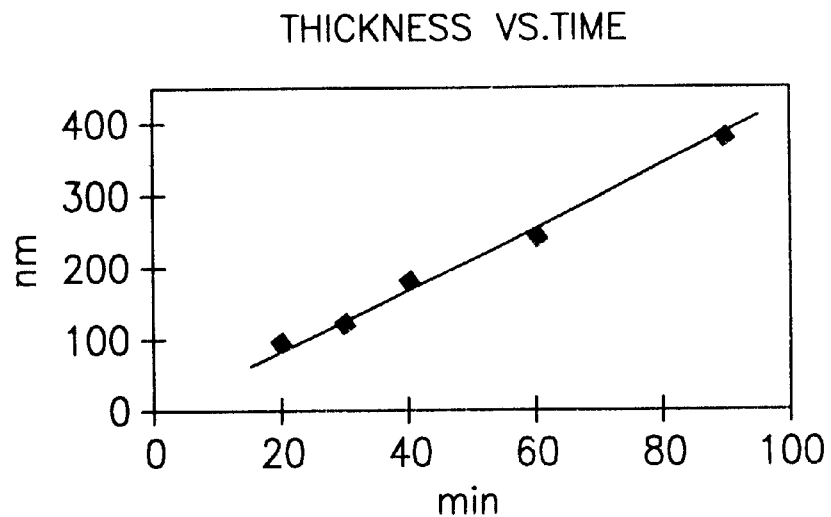
FIG. 3 is a plot of SBT film thickness as a function of time, for an illustrative low temperature CVD process of the present invention.

As mentioned, the deposition of $Bi_2O_3$ is more stable, with improved deposition rates, when using Bi(β-diketonate)$_3$ in place of the triphenyl bismuth compound heretofore used a bismuth precursor. In one embodiment, the Bi(β-diketonate)$_3$ precursor may be Bi(thd)$_3$. The improvement in deposition rate characteristics derives at least in part from the Bi(β-diketonate)$_3$ being less substrate-sensitive. FIG. 3 is a graph of film thickness in nanometers, as a function of time, in minutes, for the growth of an SBT film having the composition Sr:18%, Bi:45% and Ta:37%.

Such favorable deposition rate characteristics are also accompanied by low sensitivity to process parameters and low sensitivity to the nature of the bottom capacitor on which the ferroelectric material is deposited. The reproducibility of the process and uniformity within a wafer therefore are of superior character. Tables II and III below show the reproducibility for two different SBT film compositions measured on six-inch wafers, with the compositions being determined by x-ray fluorescence.

TABLE II

| Run No. | Sr | Bi | Ta |
|---|---|---|---|
| 1 | 18.7 | 44.6 | 36.7 |
| 2 | 18.1 | 44.9 | 37.1 |

TABLE III

| Run No. | Sr | Bi | Ta |
|---|---|---|---|
| 1 | 18 | 57.5 | 24.6 |
| 2 | 18.2 | 57.4 | 24.5 |
| 3 | 18 | 57 | 25 |

Although the discussion herein is largely directed to end use applications involving the formation of SBT films, the invention is not thus limited, and the chemical vapor deposition process of the present invention contemplates the deposition of bismuth from a bismuth β-diketonate precursor.

In one embodiment, bismuth is deposited from an anhydrous mononuclear (β-diketonate) bismuth complex. The bismuth may be deposited in combination with other metals from their respective precursors, to form multicomponent metal films.

Metal species which may be deposited on a substrate along with bismuth deposited from the (β-diketonate) bismuth precursor include, for example, potassium, calcium, strontium, barium, lead, iron, aluminum, scandium, yttrium, titanium, niobium, tantalum, tungsten, molybdenum, and lanthanide series metals including La, Ce, Pr, Ho, Eu, and Yb.

Thus, the CVD process employing the bismuth precursor in accordance with the present invention may be utilized for formation of $SrBi_2Ta_2O_9$, $SrBi_2Ta_{2-x}Nb_xO_9$ wherein x is a number between 0 and 2, $SrBi_2Nb_2O_9$, $Sr_{1-x}Ba_xBi_2Ta_{2-y}Nb_yO_9$ wherein x is a number between 0 and 1 inclusive, and y is a number between 0 and 2 inclusive, $Sr_{1-x}Ca_xBi_2Ta_{2-y}Nb_yO_9$ wherein x is a number between 0 and 1 inclusive and y is a number between 0 and 2 inclusive, $Sr_{1-x}Pb_xBi_2Ta_{2-y}Nb_yO_9$ wherein x is a number between 0 and 1 inclusive and y is a number between 0 and 2 inclusive, $Sr_{1-x-y-z}Ba_xCa_yPb_zBi_2Ta_{2-p}Nb_pO_9$ wherein x is a number between 0 and 1 inclusive, y is a number between 0 and 1 inclusive, z is a number between 0 and 1 inclusive, and p is a number between 0 and 2 inclusive.

The above-described Bi-containing oxide films may also be formed with substitution of one or more of the metal elements therein by a metal from the lanthanide series (e.g., La, Ce, Ho, Pr, Eu, Yb) or by doping of the film with a metal from the lanthanide series.

Bismuth titanate and related materials may also be formed by CVD using a (β-diketonate) bismuth precursor in accordance with the present invention, to form a film having a composition according to one of the following metal oxide formulae:

$Bi_4Ti_3O_{12}$
$PrBi_3Ti_3O_{12}$
$HoBi_3Ti_3O_{12}$
$LaBi_3Ti_3O_{12}$
$Bi_3TiTaO_9$
$Bi_3TiNbO_9$
$SrBi_4Ti_4O_{15}$
$CaBiTi_4O_{15}$
$BaBi_4Ti_4O_{15}$ $PbBi_4Ti_4O_{15}$
$Sr_{1-x-y-z}Ca_xBa_yPb_zBi_4Ti_4O_{15}$ ($0 \leq x \leq 1$, $0 \leq y \leq 1$, $0 \leq z \leq 1$)
$Sr_2Bi_4Ti_5O_{18}$
$Ca_2Bi_4Ti_5O_{18}$
$Ba_2Bi_4Ti_5O_{18}$
$Pb_2Bi_4Ti_5O_{18}$
$Sr_{2-x-y-z}Ca_xBa_yPb_zBi_4Ti_5O_{18}$ ($0 \leq x \leq 2$, $0 \leq y \leq 2$, $0 \leq z \leq 2$)
$SrBi_5Ti_4FeO_{18}$
$CaBi_5Ti_4FeO_{18}$
$BaBi_5Ti_4FeO_{18}$
$PbBi_5Ti_4FeO_{18}$
$Sr_{1-x-y-z}Ca_xBa_yPb_zBi_5Ti_4FeO_{18}$ ($0 \leq x \leq 1$, $0 \leq y \leq 1$, $0 \leq z \leq 1$)
$Bi_5Ti_3FeO_{15}$
$LaBi4Ti_3FeO_{15}$
$PrBi_4Ti_3FeO_{15}$
$Bi_6Ti_3FeO_{18}$
$Bi_9Ti_3Fe_5O_{27}$ and films of such type wherein one of the metal constituents is replaced by a metal of the lanthanide series, or wherein the film is doped with a lanthanide series metal.

Other bismuth-containing oxide films which may be formed by CVD in accordance with the invention using a (β-diketonate) bismuth precursor include the following:

$Bi_2WO_6$
$BiMO_3$ (M=Fe, Mn)
$Ba_2BiMO_6$ (M=V, Nb, Ta)
$Pb_2BiMO_6$ (M=V, Nb, Ta)
$Ba_3Bi_2MO_9$ (M=Mo, W)
$Pb_3Bi_2MO_9$ (M=Mo, W)
$Ba_6BiMO_{18}$ (M=Mo, W)
$Pb_6BiMO_{18}$ (M=Mo, W)
$KBiTi_2O_6$
$K_2BiNb_5O_{15}$

The various precursors employed in the CVD process of the present invention may be used in adducted form. Examples include (β-diketonate) strontium adducts wherein the adduct ligand may be a polyether (e.g., R—(CH$_2$CH$_2$O)$_n$—R' wherein n is a number between 2 and 6 inclusive, and each of R and R' are independently selected from H and alkyl), or a polyamine adduct, e.g., R—(CH$_2$CH$_2$NR")$_n$—R' wherein n is a number between 2 and 6 inclusive, and each of R, R' and R" are independently selected from hydrogen and alkyl. Alternative adducting ligand species include tetraglyme (=MeO—(CH$_2$CH$_2$O)$_4$—Me), triglyme (=MeO—(CH$_2$CH$_2$O)$_3$—Me), or amine adducting ligands such as N,N,N',N'-tetramethylethylenediamine, N,N,N',N",N"-pentamethyldiethylenetriamine (=Me$_2$N—(CH$_2$CH$_2$NMe)$_2$—Me) or N,N,N',N",N'",N'"-hexamethyltriethylenetetramine (=Me$_2$N—(CH$_2$CH$_2$NMe)$_3$—Me).

Bismuth- and tantalum-containing films may be formed by a CVD process in accordance with the present invention, wherein the tantalum precursor has the general formula Ta(OR)$_{5-n}$(X)$_n$ and wherein R is C$_1$–C$_5$alkyl, X is β-diketonate, with n being an integer of 1 to 5 inclusive. Tantalum precursors of such type are more fully described in U.S. Pat. No. 5,677,002 issued Oct. 14, 1997 in the names of Peter S. Kirlin, et al. For example, X in such tantalum precursor may be 2,2,6,6-tetramethylheptane-3,5-dionate, or as abbreviated "thd."

In one embodiment, a preferred tantalum precursor of the foregoing general formula is Ta(OiPr)$_4$(thd).

The various precursors employed in the broad practice of the invention to form bismuth-containing films may employ liquid delivery techniques wherein the precursor is dissolved in a suitable solvent, and the resulting liquid precursor solution is vaporized to form precursor vapor for contacting with the substrate in the CVD reactor. Such liquid delivery technique may involve mixing of all, or more than one, but less than all of the precursors in a common solvent for concurrent vaporization, e.g., as a liquid multicomponent precursor solution which is formed and then vaporized to provide the multicomponent precursor vapor for flow to the CVD reactor. Alternatively, multiple vaporizers may be employed, with separate precursors being delivered by liquid delivery to respective vaporizers where they are independently flash vaporized and the resulting vapor is thereafter mixed with vapor from another vaporizer unit, and with the joined vapor stream then being flowed to the CVD reactor.

The precursors employed in the broad practice of the present invention may be used with any suitable solvents which are compatible with the precursors dissolved therein and which do not preclude the CVD process from being carried out to produce the desired film. Illustrative of potential solvents species which may be used in the broad practice of the present invention include hydrocarbon solvents, including aliphatic, cycloaliphatic and aromatic hydrocarbons as well as substituted hydrocarbons, e.g., alcohols, ethers, esters, amines, ketones, and aldehydes.

The solvent may be employed as single species medium for the precursor, or solvent mixtures may be employed. As an illustrative example of multicomponent solvent mixtures, an 8:2:1 by volume mixture of tetrahydrofuran, isopropanol and tetraglyme may be utilized. Similar solvent mixtures utilizing, in place of the aforementioned tetraglyme component, a polyamine, may likewise be employed. Illustrative of such polyamines are N,N,N',N",N"-pentamethyldiethylenetriamine (=Me$_2$N—(CH$_2$CH$_2$NMe)$_2$—Me) and N,N,N',N",N'",N'"-hexamethyltriethylenetetramine (=Me$_2$N—(CH$_2$CH$_2$NMe)$_3$—Me)). Hydrocarbon solvents having a carbon number greater than 7 may be employed, such as octane, nonane, decane, undecane, dodecane, tridecane or tetradecane, or mixture thereof A specific solvent mixture which has advantageously been used in the broad practice of the present invention comprises a 5:4:1 by volume mixture of octane:decane:pmdeta wherein pmdeta denotes N,N,N',N",N"-pentamethyldiethylenetriamine (=Me$_2$N—(CH$_2$CH$_2$NMe)$_2$—Me).

The CVD process of the present invention contemplates using various permutations of solvents and specific precursor species, including the provision of all precursors in a single solution as a "cocktail" mixture for liquid delivery vaporization and chemical vapor deposition, as well as utilizing single component, binary, ternary and other multi-component solvent solutions. Single precursor solutions may be separately formulated and separately delivered to the liquid delivery system so that the precursor solutions are mixed before vaporization, or separate vaporizers may be employed for certain ones of multiple precursor solutions, with the resulting vapor being joined for passage to the CVD reactor.

The vapor produced by vaporization of the precursor may be mixed in the liquid delivery system with a carrier gas, which may comprise an inert gas such as argon, helium or nitrogen, and/or an oxidizer gas such as O$_2$, singlet O$_2$, ozone, NO$_x$ wherein x=1, 2, or 3, hydrogen peroxide, oxygen plasma, N$_2$O, or combinations of two or more of the foregoing oxidizer species.

The vaporization of the liquid precursors may be carried out at any suitable process conditions, with temperatures on the order of 170–230° C. being highly advantageous.

The CVD process itself may be carried out in any suitable manner, optionally enhanced by physical or chemical techniques (e.g., plasma-assisted CVD, photoactivation CVD, etc.).

The CVD reactor may be maintained at any suitable process conditions, including suitable substrate temperatures for deposition, and gaseous oxidizer may be admixed to the precursor vapor either before or after entering the CVD reactor. The CVD reactor may be maintained at any suitable pressure level during the deposition process. In one embodiment, In one embodiment, a pressure in the range of 0.001–760 torr is maintained in the reactor. Most preferably, the pressure is in a range of from about 0.1 to about 10 torr. The deposition temperature for the deposition of bismuth may be effected at temperatures below about 450° C., as for example at a temperature of 330° C. up to about 450° C., more preferably from about 350° C. to about 425° C., and more preferably from about 380° C. to about 400° C., it being recognized that the specific temperatures which are advantageously employed in a given end use application may be readily determined by ordinary skilled artisans without undue experimentation.

Flow rate of precursor vapor and any added carrier gas may be at any suitable volumetric flow rate, e.g., 1–16,000 standard cubic centimeters per minute (sccm).

In a specific application of forming bismuth-containing ferroelectric films, an anhydrous mononuclear (β-diketonate) bismuth precursor is deposited on a substrate at a temperature below about 600° C., as for example from about 330° C. to about 550° C., to form a non-ferroelectric bismuth ceramic film, which then is transformed to the ferroelectric form by transformation steps which typically comprise one or more annealing steps. The annealing may be carried out at temperatures on the order of about 600 to about 820° C., more preferably from about 600 to about 850° C., and most preferably from about 650 to about 850° C.

The process of the invention is well-suited for the formation of bismuth-containing ceramic films which can be transformed into ferroelectric films with a layered pseudo-perovskite structure (Aurivillius phase) of the following general formula: $(Bi_2O_2)^{2+}(A_{m-1}B_mO_{3m+1})^{2-}$, wherein
$A=Bi^{3+},L^{3+},L^{2+},Ca^{2+},Sr^{2+},Ba^{2+},Pb^{2+},Na^+$,
$B=Fe^{3+},Al^{3+},Sc^{3+},Y^{3+},L^{3+},L^{4+},Ti^{4+},Nb^{5+},Ta^{5+},W^{6+}$ and $Mo^{6+}$, wherein L is a lanthanide series metal ($Ce^{4+},La^{3+},Pr^{3+},Ho^{3+},Eu^{2+},Yb^{2+}$ etc.) and
m=1,2,3,4 or 5.

For the formation of such thin films, the bismuth precursor preferably is anhydrous mononuclear tris (β-diketonate) bismuth. The β-diketonate ligand may for example comprise any of the illustrative species set out below.
2,2,6,6-tetramethyl-3,5-heptanedionato;
1,1,1-trifluoro-2,4-pentanedionato;
1,1,1,5,5,5-hexafluoro-2,4-pentanedionato;
6,6,7,7,8,8,8-heptafluoro-2,2-dimethyl-3,5-octanedionato;
2,2,7-trimethyl-3,5-octanedionato;
1,1,1,5,5,6,6,7,7,7-decafluoro-2,4-heptanedionato; and
1,1,1-trifluoro-6-methyl-2,4-heptanedionato The CVD process of the present invention for forming bismuth-containing thin films may be employed in the manufacture of a wide variety of thin film products, including ferroelectric capacitors, ferroelectric transistors, e.g., field effect transistors of such type, ferroelectric random access memories, chip cards, and integrated device structures, utilizing bismuth-containing thin films such as SBT and SBT derivatives, e.g., $SrBi_2(Nb,Ta)_2O_7$ (SBNT), or alternatively $Bi_4Ti_3O_{12}$ and derivatives thereof The bismuth-containing thin film in the general practice of the present invention may be deposited over a substrate or device precursor structure, including a substrate which may be formed of silicon, optionally n- or p-doped, $SiO_2$, $Si_3N_4$, GaAs, MgO, $Al_2O_3$, $ZrO_2$, $MTiO_3$ (wherein M =Sr, Ba, Pb), or a complex integrated circuit structure.

Ferroelectric thin film capacitors may be fabricated utilizing a bismuth-containing ferroelectric thin film material, in conjunction with any suitable electrode structures. For example, such capacitor may utilize a bottom electrode formed of a material such as Pt, Pd, Au, Ir, Rh, conducting metal oxides such as $IrO_x$, $RhO_x$, $RuO_x$, $OsO_x$, $ReO_x$, $WO_x$, wherein x is between 0 and 2, conducting metal nitrides such as $TiN_x$, $ZrN_x$, wherein x is between 0 and 1.1 or $W_x,TaN_x$, wherein x is from 0 to 1.7, or a superconducting oxide (e.g., $YBa_2Cu_2O_{7-x}$ or $Bi_2Sr_2Ca_2Cu_3O_{10}$).

Additional layers may be interposed between the bottom electrode and the ferroelectric thin film in the capacitor structure, such as seed layers, conducting layers, paraelectric layers or dielectric layers. Such a capacitor may have a top electrode of platinum or other suitable material.

The ferroelectric capacitor may be employed as a stack capacitor interconnected by a plug with a transistor on a substrate, as shown in FIG. 2 hereof, optionally with a further barrier layer (not shown in FIG. 2) between the bottom electrode 34 and the plug 38. The plug may be formed of polysilicon or tungsten, and may as shown be fabricated on the drain of a MOSFET, and the optional additional layers between the bottom electrode and plug (not shown in FIG. 2) may constitute adhesion layers, diffusion barrier layers, or the like.

The specific CVD process methodology used to form the bismuth-containing film may be widely varied, and may for example comprise the steps of positioning a substrate in the CVD reactor chamber, heating the substrate up to a deposition temperature, flushing the substrate with a mixture of inert gas and oxidizer, delivering precursor vapor mixed with inert carrier gas and, if required, an oxidizer, exposing the substrate to such precursor vapor following which precursor vapor flow is discontinued and the substrate is flushed with a mixture of inert gas and, if required, an oxidizer, with the substrate then being cooled and removed from the chamber, or removed for such cooling. The oxidizer may comprise any suitable oxidizing species, including $O_2$, singlet $O_2$, ozone, $NO_x$ wherein x=1, 2, or 3, hydrogen peroxide, oxygen plasma, $N_2O$, and mixtures of two or more of the foregoing oxidizer species.

The substrate may be pretreated in the CVD reactor prior to deposition by exposing the substrate to vapors of a predetermined composition and/or annealing. The CVD step may be carried out in a single continuous process, or in discrete steps, e.g., with intermediate removal of the substrate from the CVD chamber for performing other processing on the substrate, following which the substrate is reintroduced to the CVD chamber to continue CVD of the bismuth-containing material. The CVD process may be carried out with variation of process conditions (e.g., temperature, pressure, flow rates and gas phase composition) over the period of the process, or such process conditions may be maintained at stable set point values during the process.

The bismuth-containing film may be annealed for converting the film to a ferroelectric state, prior to deposition of a top electrode thereover, followed by additional annealing, or such annealing may simply be carried out after the top electrode has been formed on the bismuth-containing thin film. The annealing step generally may be carried out at temperatures on the order of about 600 to about 820° C.

The features and advantages of the present invention are more fully shown by the following illustrative examples.

EXAMPLE I

Deposition of $Bi_2O_3$

In a warm-wall (200° C.) quartz tube reactor five inches in diameter a $Pt/SiO_2$ substrate (100 nm Pt, 2 inches in diameter) was placed vertical to the direction of flow. The substrate was heated to 620° C. A precursor 0.3 molar solution of commercially available $Bi(thd)_3$ dissolved in THF/iPrOH/tetraglyme in an 8:2:1 by volume ratio was flash evaporated at 200° C. on a hot stainless steel frit at a delivery rate of 0.11 ml/minute and at the same pressure than inside the reactor. The vapor was transported with 200 sccm Ar carrier gas into the reactor. At the inlet, the precursor vapor was mixed with an additional 300 sccm Ar and 500 sccm $O_2$. The pressure inside the reactor was between 0.5 and 8 torr. At 2 torr a film of 290 nm $Bi_2O_3$ was deposited. After the deposition the sample was allowed to cool in a stream of 500 sccm $O_2$ and 300 sccm Ar inside the reactor and then removed.

Figure 4:
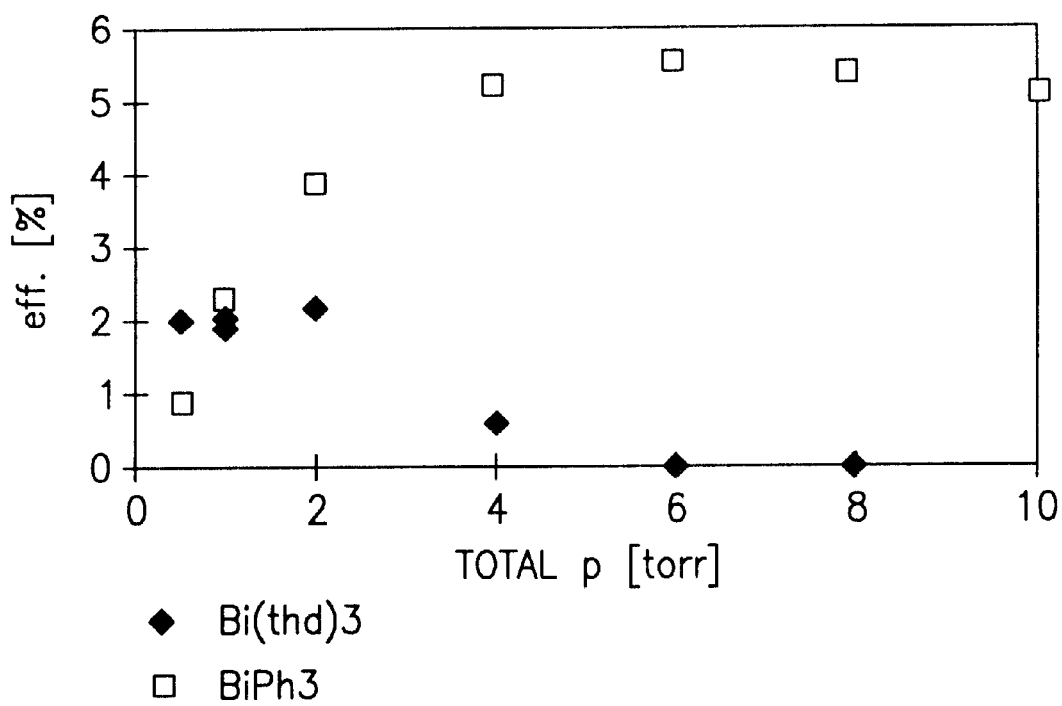
FIG. 4 is a plot of the deposition efficiency as a function of the reactor pressure, for the deposition of $Bi_2O_3$ for the precursors $Bi(thd)_3$ and triphenylbismuth.

The graph of FIG. 4 is a plot of the deposition efficiency as a function of the reactor pressure, for the deposition of $Bi_2O_3$ for the precursors $Bi(thd)_3$ and triphenylbismuth.

Figure 5:
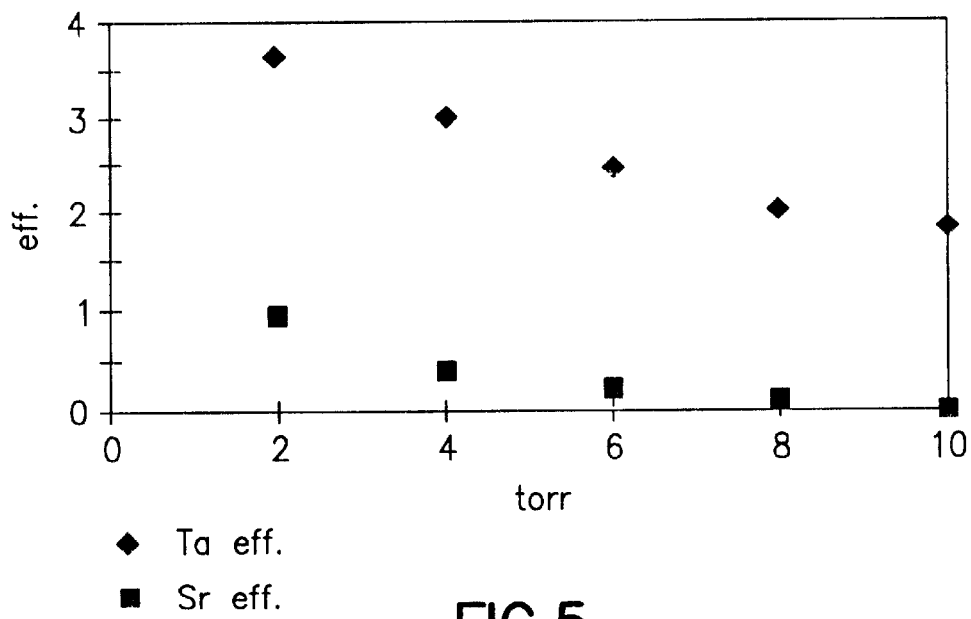
FIG. 5 is a plot of the deposition efficiency as a function of the reactor pressure (for the same reactor and pressure conditions of FIG. 4), for the precursors $Sr(thd)_2$ (tetraglyme) and $Ta(thd)(OiPr)_2$.

FIG. 5 is a plot of the deposition efficiency as a function of the reactor pressure (for the same reactor and pressure conditions of FIG. 4), for the precursors $Sr(thd)_2$ (tetraglyme) and $Ta(thd)(OiPr)_2$.

EXAMPLE II

SBT is deposited on a substrate utilizing $Sr(thd)_2$ (tetraglyme) as the Sr precursor, mononuclear $Bi(thd)_3$ as the bismuth precursor and $Ta(OiPr)_4(thd)$ as the tantalum precursor. The precursors are each dissolved in a solvent mixture and stored separately in three respective reservoirs. The solvent for each precursor is a 8:2:1 by volume mixture of tetrahydrofuran:isopropanol:tetraglyme. Molar concentrations of the precursors are 0.4 molar for the tantalum precursor, 0.25 molar for the bismuth precursor, and 0.15 molar for the strontium precursor.

Prior to delivery, the three precursor solutions are mixed in a liquid delivery system to provide the desired precursor composition. The precursor mix is delivered by a pump, preferably at a volume entry flow rate in the range of from about 0.05 to about 0.25 milliliters per minute, to a vaporizer comprising two chambers separated by a frit. The vaporizer is maintained at a temperature in the range from about 170 to about 200° C.

The precursor solution is introduced to the hot surface of the frit to vaporize the solvent and precursors via flash vaporization. Argon carrier gas, preferably at a flow rate of from about 200 to about 600 sccm, is flowed through the vaporization unit to transport the precursor vapor to a showerhead disperser assembly where the precursor vapor is mixed with additional argon and with oxygen as an oxidizer.

The resulting mixture of precursor vapor, carrier gas and oxidizer enters the CVD chamber and is directed at the hot substrate, whose temperature is maintained by a resistively heated chuck. After decomposing at the hot surface of the substrate to deposit the SBT film, the gases are exhausted from the CVD chamber through a cold trap into a vacuum pump with high conductance. Pressure in the system is maintained by a throttle valve and by adjustment of total gas flow. All reactor walls as well as the showerhead and connecting lines (vaporizer-showerhead, chamber-cold trap) are heated to a temperature in the range of 170–260° C.

The deposition is carried out on a substrate, e.g., a $Pt/Ti/SiO_2/Si$ wafer wherein the platinum thickness is 100 nanometers and the titanium thickness is 10 nanometers, introduced to the CVD chamber through a load lock and put on the hot chuck. The wafer is heated up to process temperature, then oxygen gas flow is turned on to establish the oxygen/argon ratio at a desired value. Following establishment of such ratio, the precursor gas is flowed into the chamber and deposition is carried out, following which the precursor vapor flow is turned off and the chamber is flushed with the argon/oxygen mixture. The wafer then is removed from the chamber through the load lock.

The foregoing deposition may be carried out with the process conditions as set out below in Table IV:

TABLE IV

| | |
|---|---|
| Precursor - Gas Phase Composition | Sr: 15.5%; Bi: 63.7%; Ta: 21.15% (atomic percent) |
| Deposition Temperature | 430° C. |
| Total Gas Pressure | 1 Torr |
| Total Gas Flow | 1900 sccm |
| Oxygen Content | 50 vol % |
| Substrate | 100 nm Pt/ 30 nm Ti/ 625 nmSiO$_2$/Si |
| Coating Time | 30 minutes |
| Film Composition | Sr: 18.1%; Bi: 44.9%; Ta: 37.1% (atomic percent) |
| Film Thickness | 126.3 nanometers |

Figure 6:
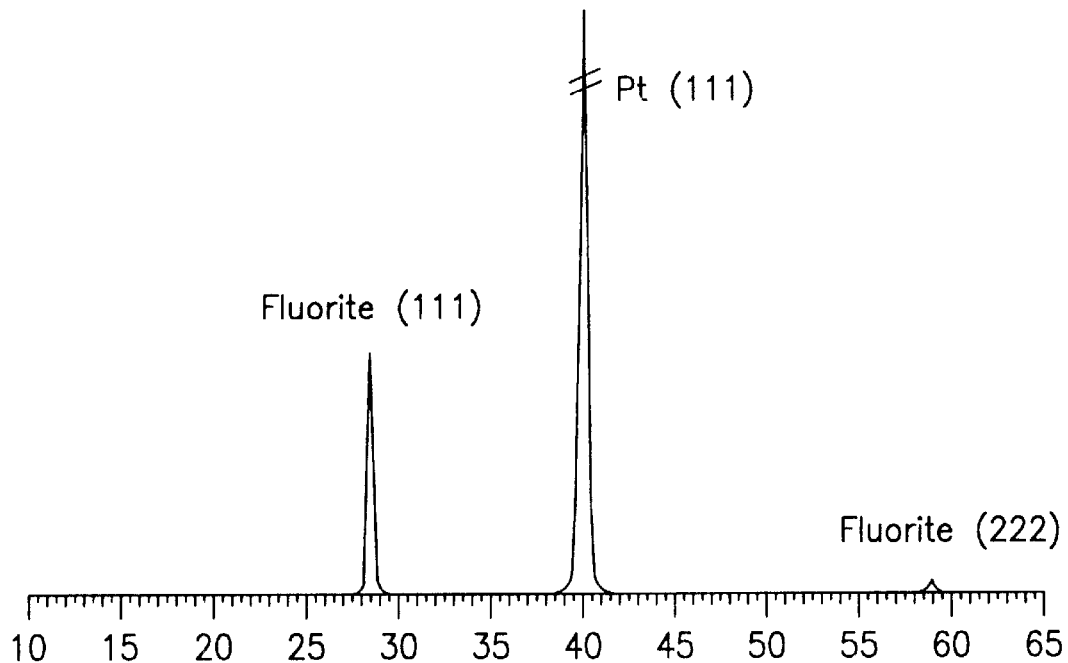
FIG. 6 is an x-ray diffraction spectrum of an SBT film deposited in accordance with the invention.

The as-deposited film Produced by the foregoing process is specular and has a high density. SEM images show grains having a size on the order of 80 nm. The x-ray diffraction spectrum of the as-deposited film reveals two peaks which can be assigned to an oriented fluorite structure as shown in FIG. 6. Such oriented fluorite structure can be transformed to a desired Aurivillius phase by post-deposition annealing.

EXAMPLE III

Figure 7:
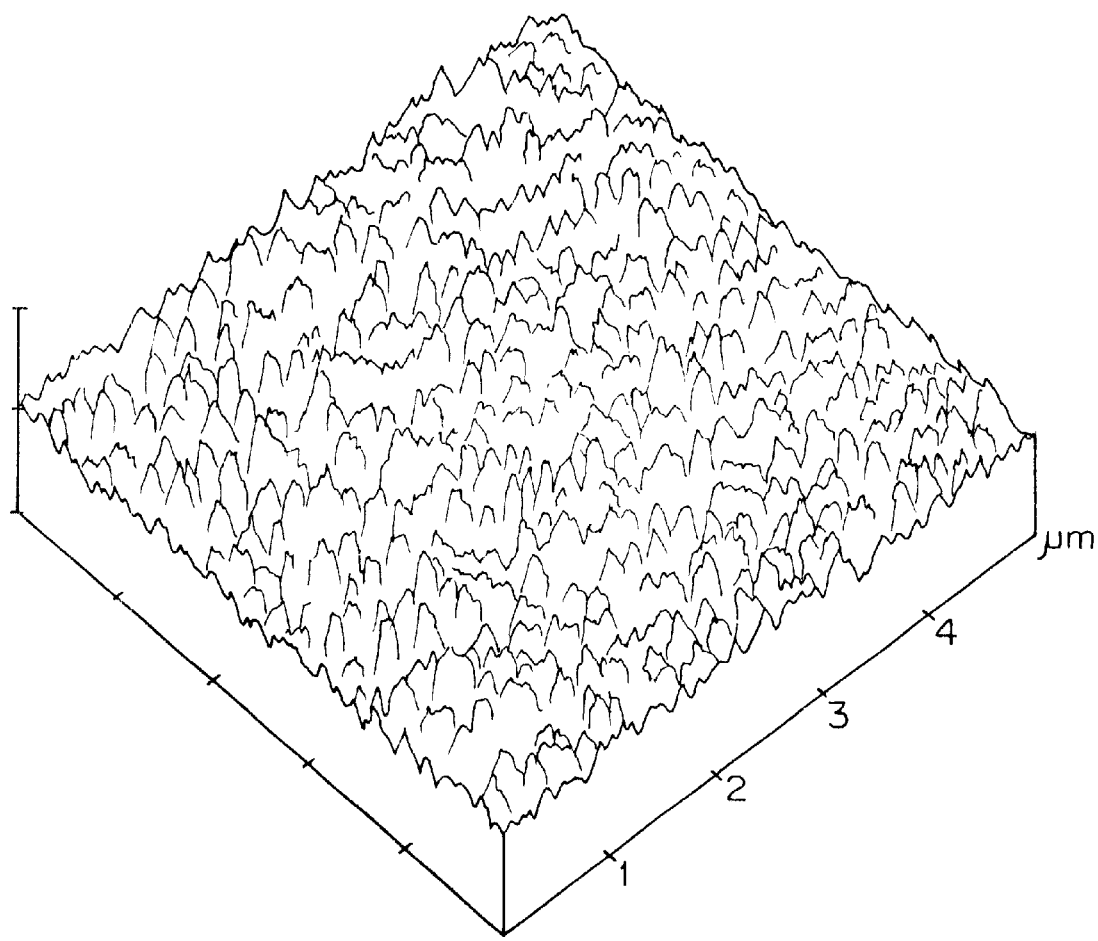
FIG. 7 is an atomic force microscope (AFM) map of an SBT film having a mean thickness of 216 nanometers, as deposited by chemical vapor deposition.
Figure 8:
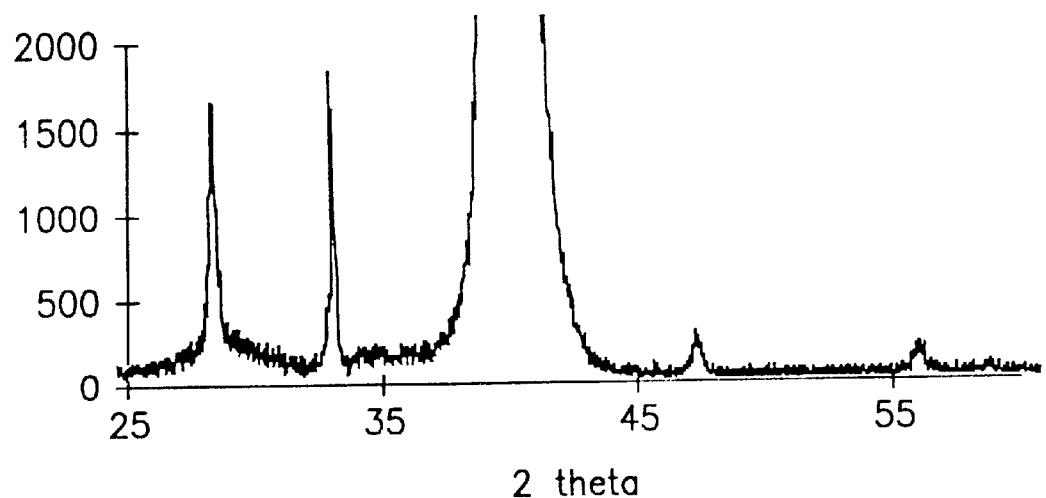
FIG. 8 is an x-ray diffraction spectrum of an SBT film deposited in accordance with the present invention at 385° C.

An SBT film was deposited by CVD using a process similar to that described in Example I, but at a deposition temperature of 385° C. FIG. 7 shows an atomic force microscope (AFM) map of a sample produced by a process similar to that described above, wherein the SBT film is deposited at 385° C. and has a composition of 18.6 atomic % Sr, 43.4 atomic % Bi and 38.0 atomic % Ta, with a film thickness of 216 nanometers. The mean roughness of such surface is 6.8 nanometers. The Cu K-alpha x-ray diffraction spectrum of the resulting film is shown in FIG. 8, with fluorite (111), (220), (220), and (311), reflections at 28.3°, 32.9°, 47.1° and 56.0°, respectively.

EXAMPLE IV

Figure 10:
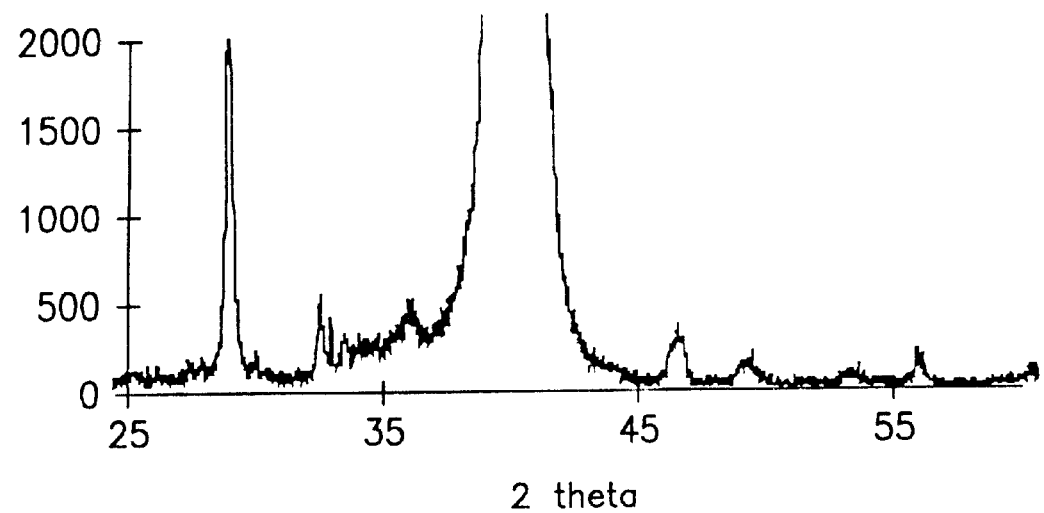
FIG. 10 is an x-ray diffraction spectrum of another SBT film deposited in accordance with the present invention, at 385° C., and then annealed at 800° C.
Figure 9:
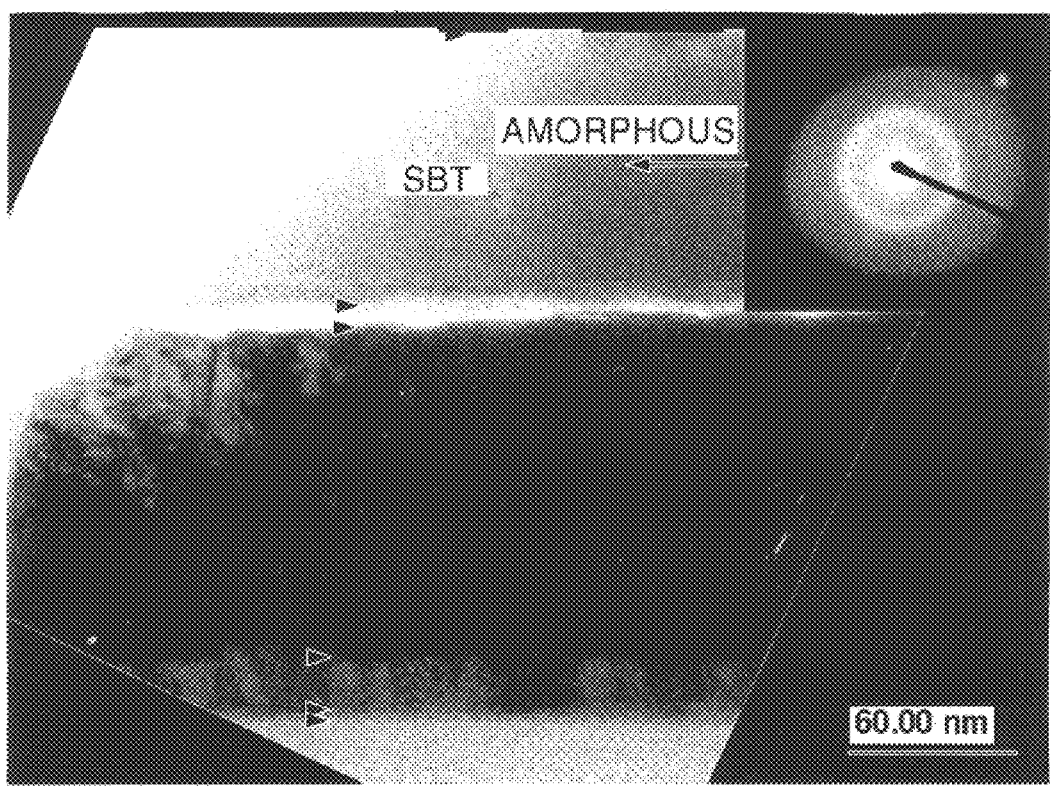
FIG. 9 is a transmission electron microscope (TEM) bright field image of an SBT film on a platinum substrate, together with an inset electron diffraction pattern indicating the amorphous character of such SBT layer.

An SBT film was deposited on a platinum substrate by a process of the general type described in Example III. The Pt layer was approximately the same thickness as the SBT layer, as is shown in the TEM bright field image of the as-deposited film in FIG. 9, the inset portion of which is an electron diffraction pattern evidencing the amorphous character of most of the SBT film. Upon annealing in oxygen, such amorphous layer is converted to the Aurivillius SBT phase as shown in FIG. 10, which is a Cu K-alpha x-ray diffraction spectrum of a sample deposited at 385° C. and annealed at 800° C.

EXAMPLE V

A solution containing 7 mol-% Sr(thd)$_2$ (pentamethyldiethylenetriamine), 55 mol-% Bi(thd)$_3$, and 38% Ta(OiPr)$_4$(thd) in a 5:4:1 octane:decane:pentamethyldiethylenetriamine solvent mixture is metered at a flow rate of 0.2 milliliters per minute to the liquid delivery system, where it is flash vaporized at 190° C. and then transported to the CVD chamber in 400 sccm argon. This precursor-containing vapor stream is mixed with 1100 sccm oxygen and an additional 100 sccm argon for a combined 7:3 oxygen:argon ratio as it passes through a showerhead disperser into the CVD chamber which is maintained at 1 torr.

Figure 11:
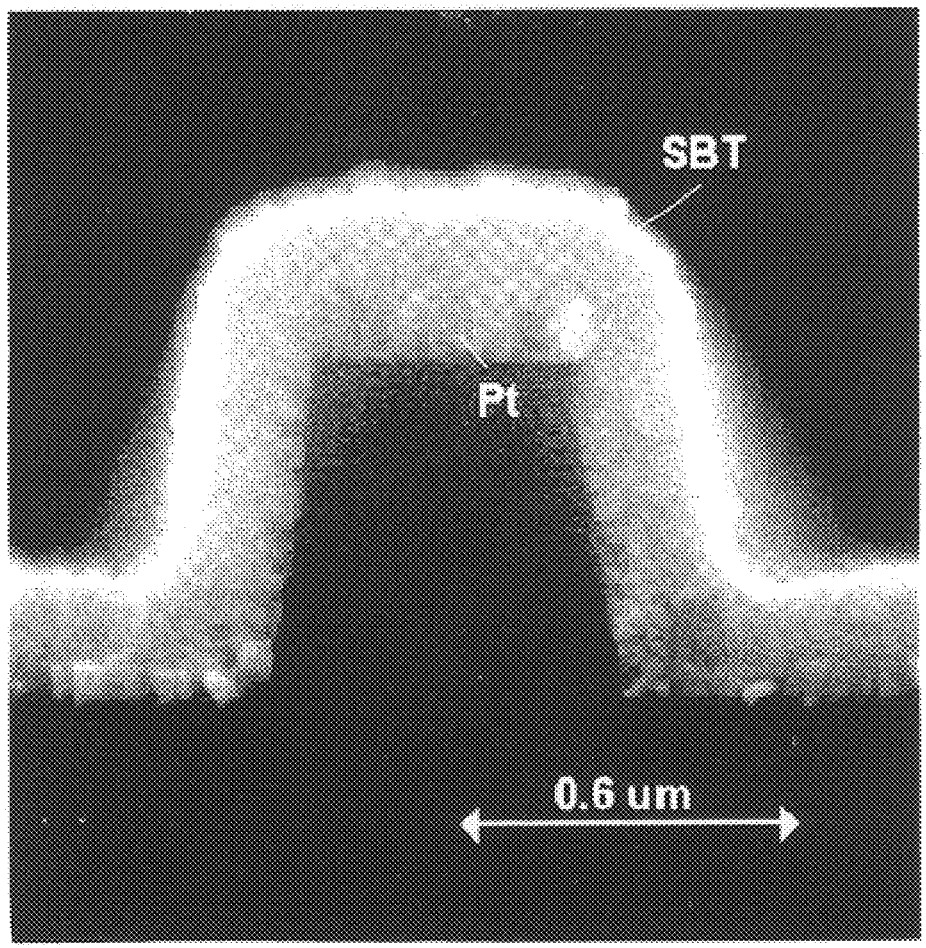
FIG. 11 is a micrograph of an SBT film on a 0.5 micron line silicon dioxide (TEOS) structure covered with platinum.

Decomposition occurs on a substrate heated to a surface temperature of 385° C. The substrate comprises a 0.5 micron line width plasma deposited SiO$_2$(TEOS) structure covered with platinum. FIG. 11 is a micrograph showing the conformality of the SBT film on this structure. The minimum SBT thickness achieved is greater than 90% of the maximum thickness (side wall thickness to top surface thickness), satisfying the requirements for microelectronic device fabrication. The low temperature and amorphous nature of the deposition permits the conformal coating of the substrate. Under such conditions, the composition varies legs than 5% relative (0.5% being the precision of the x-ray fluorescence method employed) between 30 millimeter spots on a 150 millimeter wafer.

EXAMPLE VI

An as-deposited film formed by a process similar to that of Example III was annealed at 800° C. for one hour in an oxygen gas stream (2.5 slm). Top electrodes then were deposited by deposition of 200 micrometer thickness platinum through a shadow mask. The average size of the top electrodes was between $4 \times 10^{-4}$ and $2 \times 10^{-3}$ cm$^2$. After the deposition of the top electrodes the capacitors were annealed again at 800° C. for 15 minutes in a 2.5 slm oxygen flow.

Figure 12:
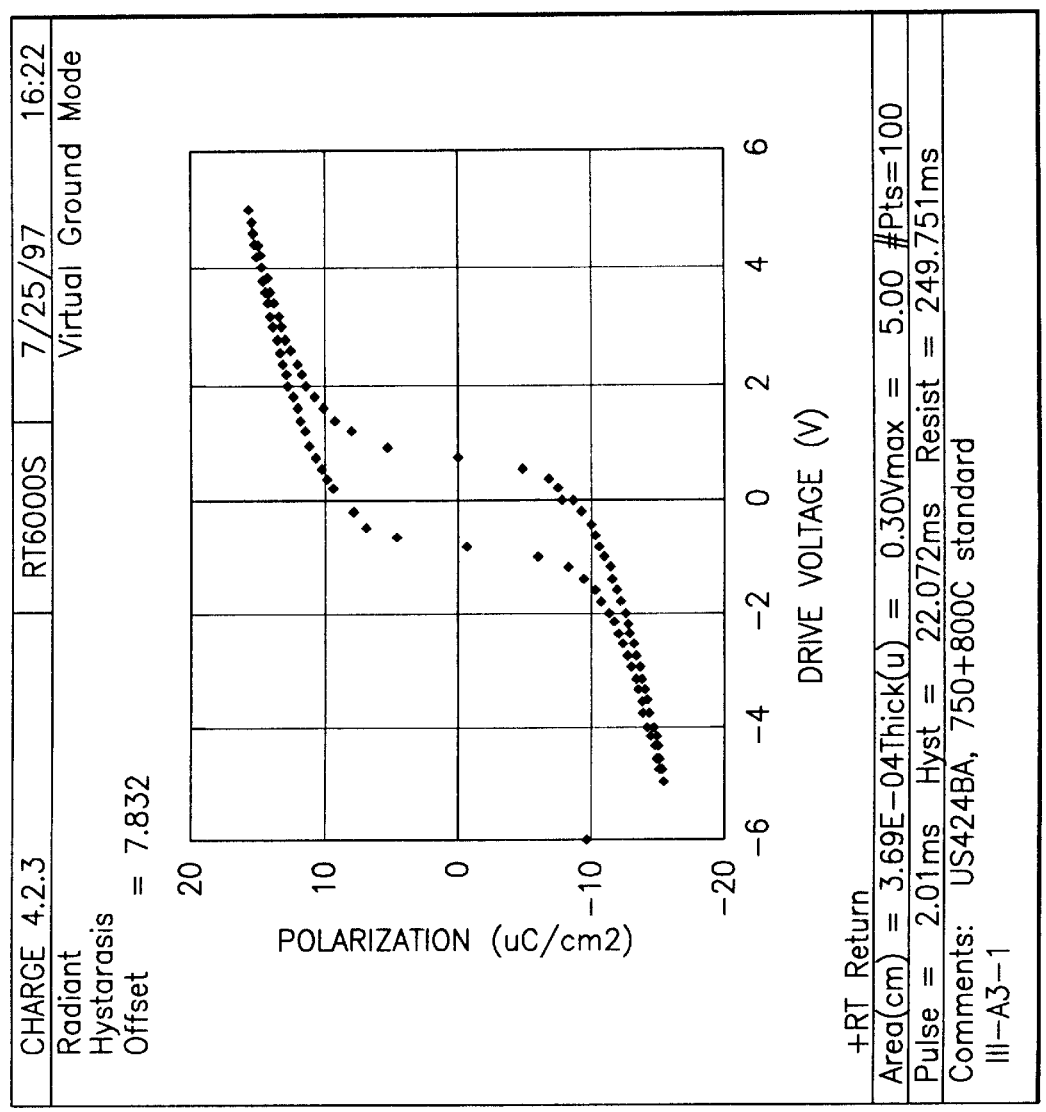
FIG. 12 is a polarization plot showing the electrical hysteresis character of an SBT film deposited at 385° C. and annealed at 800° C.

Electrical characterization using a Radiant RT6000S revealed a value of 17.41 $\mu$C/cm$^2$ for the remanent polarization and a coercive field of 42 kV/cm. FIG. 12 is a polarization plot showing the electrical hysteresis character of the SBT film deposited at 385° C. and annealed at 800° C.

EXAMPLE VII

A solution containing 18 atomic % Sr(thd)$_2$ (pentamethyldiethylenetriamine), 40 atomic % Bi(thd)3 and 42 atomic % Ta(OiPr)$_4$(thd) in a solvent mixture (5:4:1 octane:decane:pentamethyldiethylenetriamine) is metered to the process where it is flash vaporized at 190° C. and then flowed to the deposition reactor chamber in 400 sccm argon. The vapor is mixed with 6000 sccm O$_2$ and additional 3600 sccm argon for a combined 6:4 oxygen: argon ratio. The resulting combined stream is passed through a showerhead disperser into the reactor chamber which is maintained at 9 torr. Decomposition occurs on a substrate heated to a surface temperature of 385° C. Under these conditions, the film has no evidence of fluorite phase by x-ray diffraction, and can be converted to the Aurivilius phase without a clear intermediate fluorite phase.

EXAMPLE VIII

At a deposition pressure of 9 torr, depositions of SBT films were carried out in the manner of Example VII but with the specific process conditions shown in Table V below.

TABLE V

| | Process Conditions | | | Results | |
|---|---|---|---|---|---|
| Run Number | Liquid Delivery Rate, ml/min | Total Gas Flow sccm | Temperature ° C. | Growth Rate nm/min | XRD of film |
| 1 | 0.1 | 10000 | 430 | 2.8 | fluorite |
| 2 | 0.2 | 1600 | 430 | 2.3 | fluorite |
| 3 | 0.1 | 1600 | 380 | 2.7 | fluorite |
| 4 | 0.2 | 10000 | 380 | 4.7–5.7 | amorphous |

Runs 1–3 had a low growth rate and showed a fluorite phase in the as-deposited film. Electrical properties, annealing behavior and surface morphology of these films were similar to those deposited at 1 torr and described in the earlier examples herein.

Figure 13:
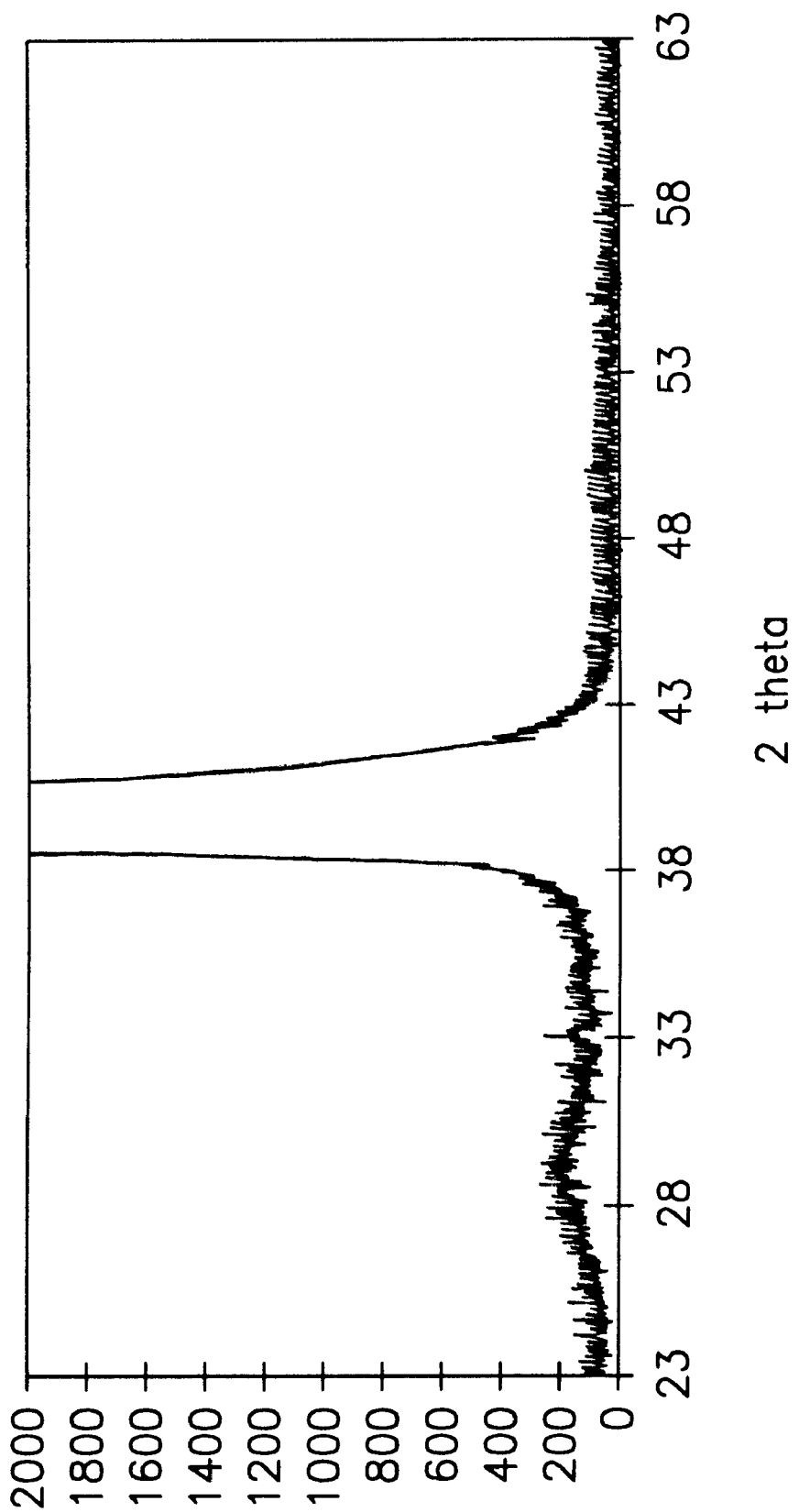
FIG. 13 is an x-ray diffraction spectrum of an amorphous SBT film deposited in accordance with the present invention, at 380° C.

Run 4 had a signifcantly higher deposition rate and showed only amorphous material in the as-deposited film, as is apparent from the FIG. 13 x-ray diffraction spectrum of the amorphous SBT film produced in Run 4. The results of Run 4 are reproducible.

It is assumed that both deposition temperature and growth rate mainly determine whether an as-deposited film is amorphous or partly crystallized. Thus, increasing the growth rate and decreasing the temperature will lower the migration of Bi species at the surface. However, if the Bi mirgration is lowered or—in the best case—suppressed, there will be less tendency for a crystallization to occur during the deposition. At a temperature of 380° C. and growth rates of 4.7–5.7 nm/minute, the film is amorphous. It therefore should be possible to deposit amorphous films even at higher temperatures such as 430° C. or 450° C. if the growth rate is high enough.

The foregoing results are likewise applicable to other Bi precursors, with which formation of amorphous films may be carried out at sufficiently low temperatures and sufficiently high growth rate.

In the case of the commonly employed Bi aryl precursors it may be more difficult to obtain the high growth rates at the temperatures discussed above, but this difficulty may be surmounted by using means such as RF plasma, photoactivation or process additives such as alcohols to achieve sufficient deposition rates for Bi$_2$O$_3$ at lower temeratures. Other Bi precursors such as Bi carboxylates, Bi alkoxides and Bi amides have low deposition temperature and therefore are potentially usefully employed in the formation of amorphous SBT films.

To our knowledge, the prior art has not achieved the deposition of amorphous SBT films by chemical vapor deposition, but has rather relied on the formation of fluorite phase films of Aurivillius phase films, which are then completely transformed into the Aurivillius phase by a ferroanneal procedure.

The amorphous films of the invenition have shown superior properties to all other deposited films of the prior art, for the following reasons.

First, the transformation of the film into the ferroelectric Aurivillius phase during the ferroanneal is much faster than for the crystalline films. This fact significantly reduces the thermal budget during processing. It is commonly considered to be conventional wisdom that without a reduction of the thermal budget the practical commercial manufacture of high density FRAMs is not possible.

Figure 14:
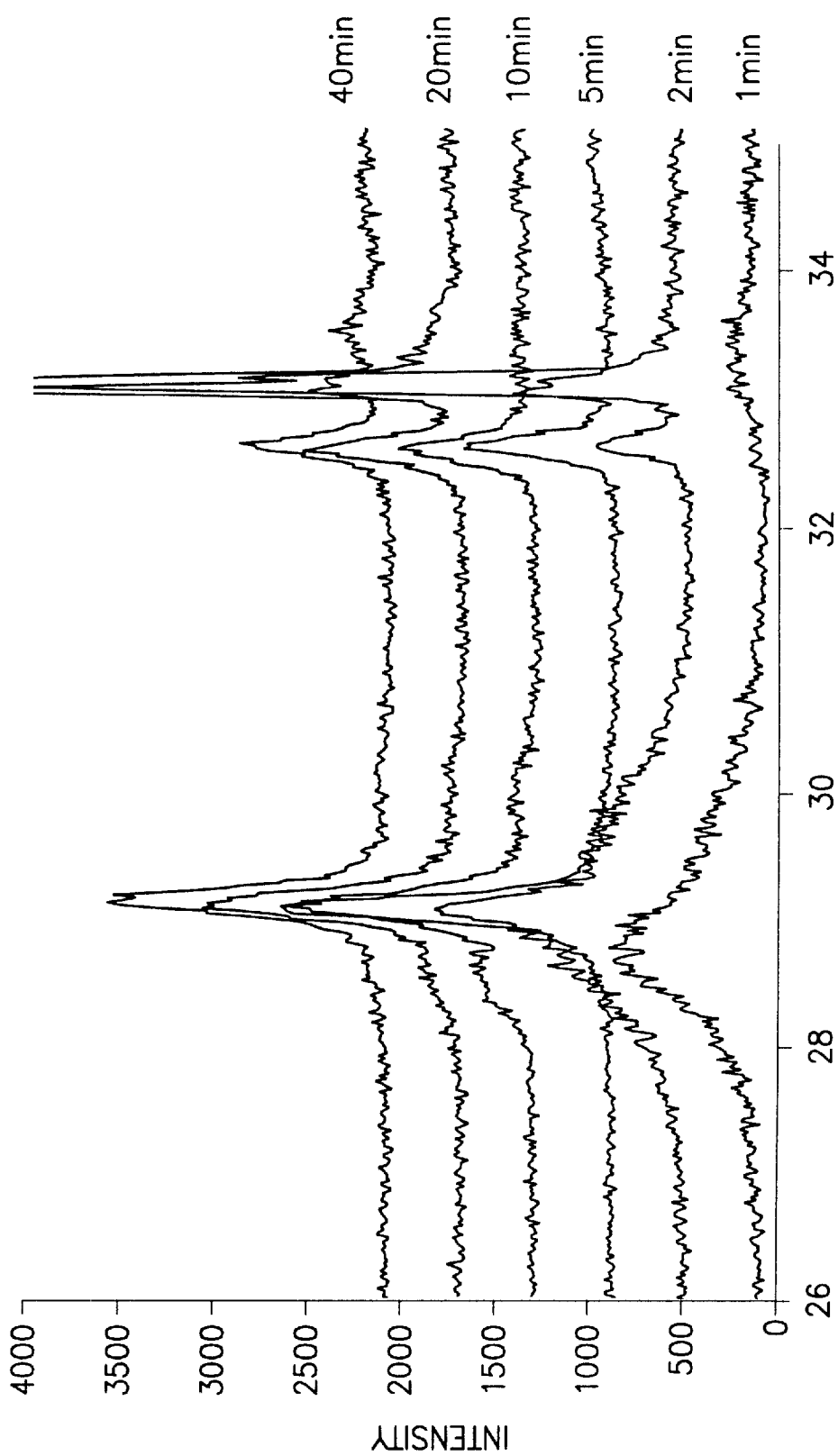
FIG. 14 is an x-ray diffraction spectrum of an SBT film deposited in accordance with the present invention, at 380° C., and annealed at 750° C. for 5 minutes to form the Aurivillius phase.

FIG. 14 is an x-ray diffraction spectrum of an Aurivilius phase film, formed from an amorphous as-deposited SBT film deposited at 380° C., and subjected to annealing at 750° C. for 5 minutes to form the Aurivillius phase.

Figure 15:
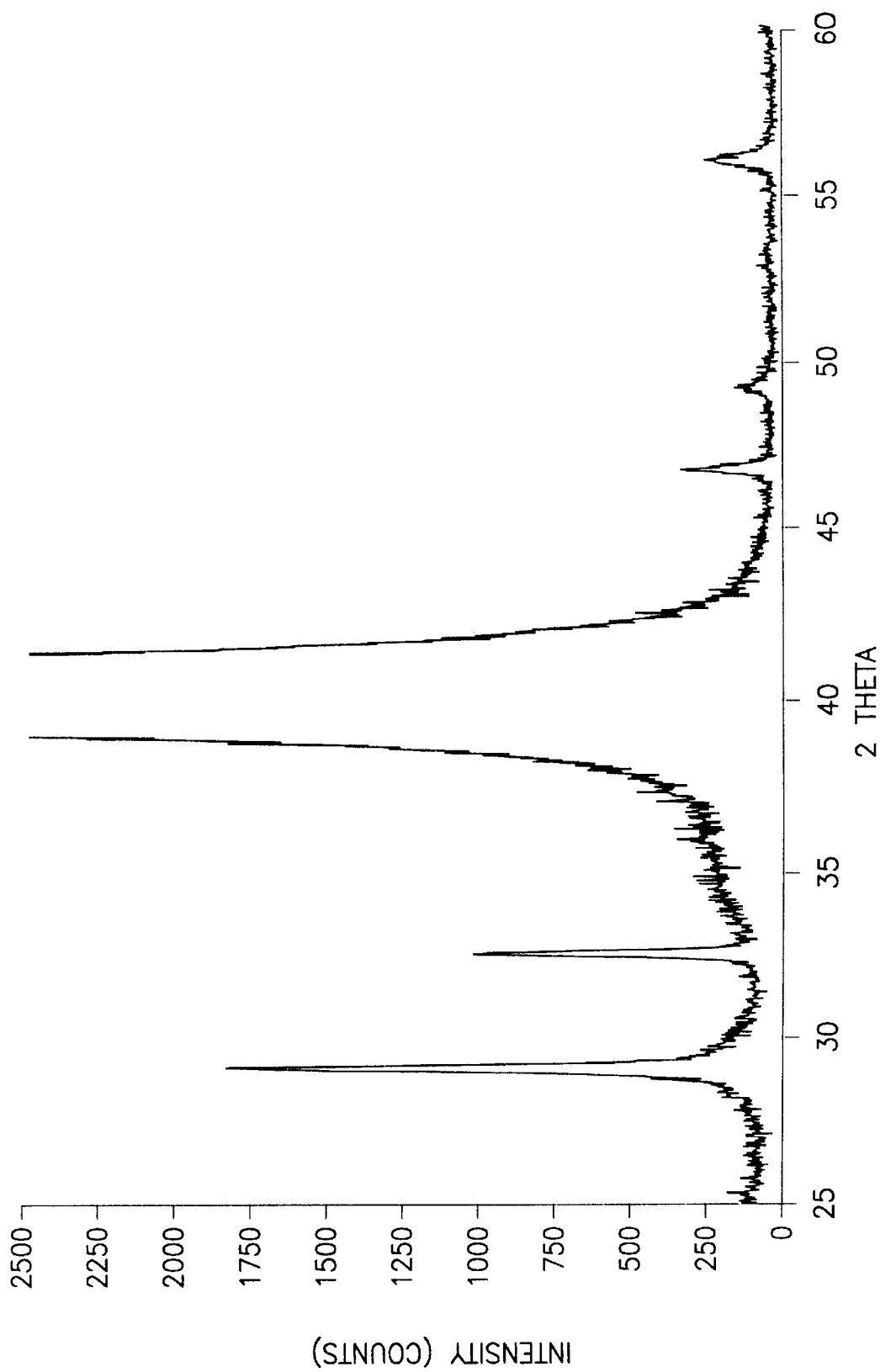
FIG. 15 is an x-ray diffraction spectrum of another SBT film deposited in accordance with the present invention, at 380° C., and then annealed at 700° C. for 10 minutes to form the Aurivillius phase.

FIG. 15 is an x-ray diffraction spectrum of another Aurivillius phase SBT film deposited in accordance with the present invention, deposited at 380° C. and then annealed at 700° C. for 10 minutes to form the Aurivillius phase with complete phase transformation.

Second, the ferroelectric properties of the ferroannealed films are superior to those generated from crystalline as-deposited films. The $2P_r$ values were significantly increased and at lower annealing temperatures high $2P_r$ values are possible.

Thus, for an annealing temperature of 800° C., $2P_r$ values of up to 24.5 $\mu C/cm^2$ were achieved. At 750° C., the $2P_r$ values of up to 21 $\mu C/cm^2$ were still obtainable.

Third, the amorphous films are much smoother than the crystalline films.

The foregoing results show that an amorphous SBT CVD film may be formed at a low deposition temperature. This amorphous CVD film may be converted directly to the Aurivillius SBT phase, or converted through an intermediate fluorite phase to the Aurivillius SBT phase. The deposited film may also be formed as a mixed amorphous and fluorite phase film which is then converted to the Aurivillius SBT phase. The foregoing results also show that a highly conformal SBT film may be readily formed by the low temperature CVD process of the invention.

While the invention has been described with respect to particular aspects, features and embodiments, it will be appreciated that the invention is not thus limited, and other variations, modifications and other embodiments will readily suggest themselves to those of ordinary skill in the art. Accordingly, the invention is to be broadly construed in accordance with the ensuing claims.

What is claimed is:

1. A method of depositing bismuth or a bismuth-containing film on a substrate from a precursor therefor, comprising vaporizing a bismuth β-diketonate precursor to form a vaporized precursor, and contacting the vaporized precursor with the substrate to deposit bismuth or a bismuth-containing film thereon, wherein the bismuth β-diketonate precursor comprises tris (β-diketonate) bismuth whose β-diketonate moiety is selected from the group consisting of:

2,2,6,6-tetramethyl-3,5-heptanedionato
   1,1,1-trifluoro-2,4-pentanedionato;
   1,1,1,5,5,5-hexafluoro-2,4-pentanedionato;
   6,6,7,7,8,8-heptafluoro-2,2-dimethyl-3,5-octanedionato;
   2,2,7-trimethyl-3,5-octanedionato;
   1,1,1,5,5,6,6,7,7,7decafluoro-2,4-heptanedionato; and
   1,1,1-trifluoro-6-methyl-2,4-heptanedionato.

2. A method according to claim 1, wherein the bismuth β-diketonate precursor comprises an anhydrous mononuclear bismuth β-diketonate, and the step of contacting the vaporized precursor with the substrate to deposit said bismuth or bismuth-containing film on the substrate is conducted at temperature below about 450° C.

3. A method according to claim 1, wherein the bismuth β-diketonate precursor comprises an anhydrous mononuclear bismuth β-diketonate.

4. A method according to claim 1, wherein the bismuth β-diketonate precursor comprises a mixture of different bismuth β-diketonates.

5. A method according to claim 1, wherein the bismuth β-diketonate precursor comprises anhydrous mononuclear tris (2,2,6,6-tetramethyl-3,5-heptanedionato) bismuth.

6. A method according to claim 1, wherein said vaporizing of said bismuth (β-diketonate) precursor to form the vaporized precursor, comprises liquid delivery and flash vaporization of said bismuth (β-diketonate) precursor.

7. A method according to claim 1, using combinations of single, binary or ternary precursor solutions for precursors of said bismuth or bismuth-containing film, and further comprising mixing the single precursor solutions in a liquid delivery system before said vaporizing step.

8. A method according to claim 1, wherein the bismuth β-diketonate precursor comprises a bismuth composition of the formula $$BiA_xB_y$$

wherein:

A=β-diketonate;
B=another ligand compatible with Bi and A in the composition;
x=1,2 or 3; and
y=3−x.

9. A method according to claim 1, wherein said bismuth-containing film is deposited on the substrate.

10. A method according to claim 1, wherein said contacting is conducted at a temperature of from about 330 to about 380° C.

11. A method according to claim 8, wherein x=1 and each B is different.

12. A method according to claim 9, wherein the bismuth-containing film comprises a film composition selected from the group consisting of $SrBi_2Ta_2O_9$, $Bi_4Ti_3O_{12}$, and superconducting Bi-containing films.

13. A method according to claim 9, wherein the bismuth-containing film comprises $SrBi_2Ta_2O_9$.

14. A method according to claim 10, wherein the tris (β-diketonate) bismuth complex comprises anhydrous mononuclear tris(2,2,6,6-tetramethyl-3,5-heptandionato) bismuth.

* * * * *